March 7, 1950 E. G. HILLS 2,499,584

SIGNAL-SEEKING TUNER

Filed Oct. 15, 1945

INVENTOR.
ELMER G. HILLS
BY Mueller, Dodds & Mason

ATTORNEYS

Patented Mar. 7, 1950 2,499,584

UNITED STATES PATENT OFFICE 2,499,584

SIGNAL-SEEKING TUNER

Elmer G. Hills, Chicago, Ill., assignor to Belmont Radio Corporation, a corporation of Illinois Application October 15, 1945, Serial No. 622,465

14 Claims. (Cl. 250—20)

Figures 1, 2, 3:
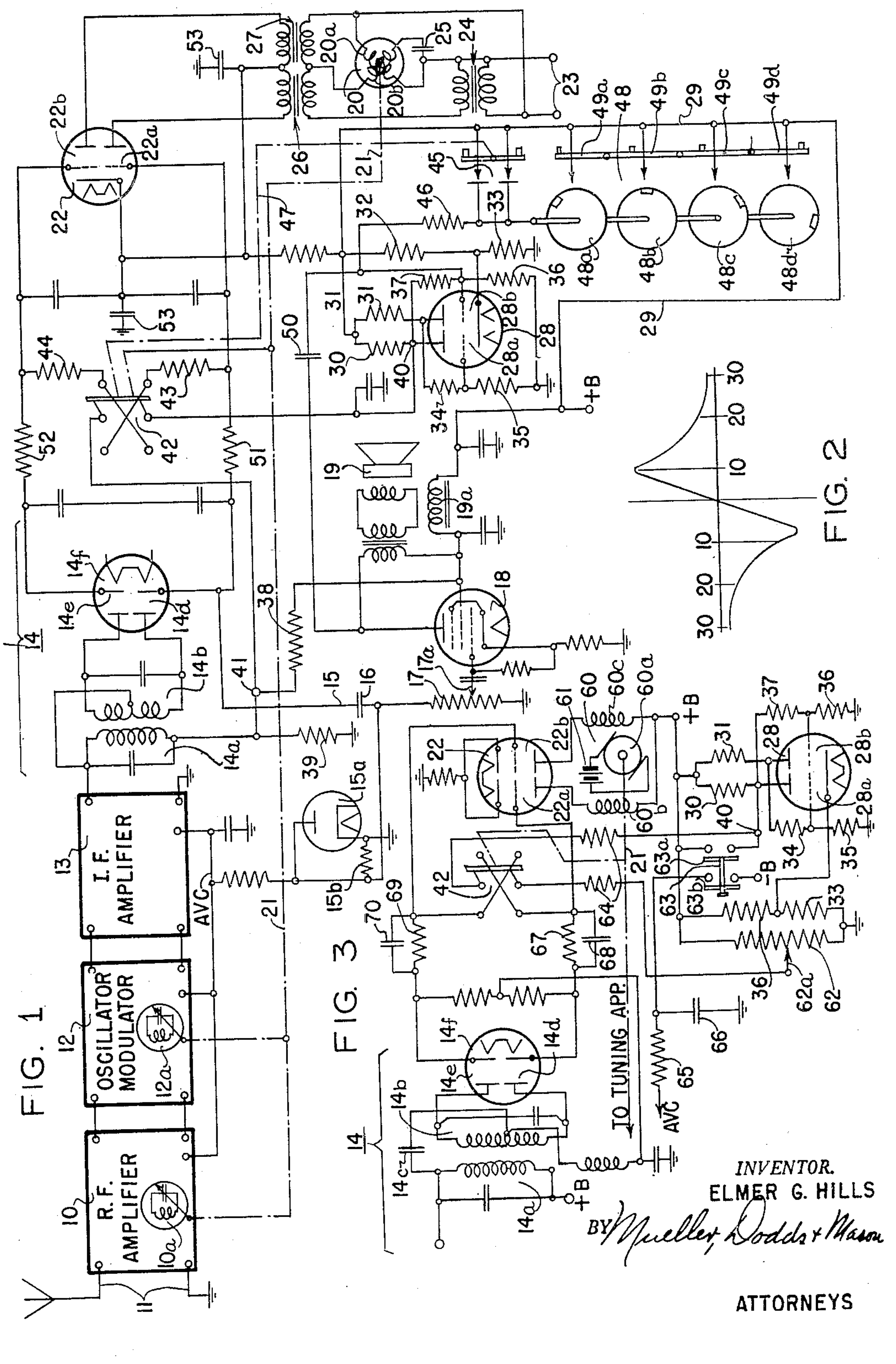

This invention relates to signal-seeking tuners and more particularly to such tuners for radio broadcast receivers of the type which sweeps over the tuning range until a station is reached from which the signal is above a predetermined minimum acceptable signal strength and which rests in such position.

In certain broadcast receivers it is desirable to procure the ease of tuning characteristic of push-button tuning apparatus while at the same time it is desired to avoid the presetting feature characteristic of such tuners. For example, in the case of automobile receivers the tuning of the local stations of greatest signal strength varies from place to place so that it becomes impracticable to set up a push-button tuner in such a way as to be useful as a car is driven over considerable distances.

It is an object of the invention, therefore, to provide a new and improved tuner for a radio broadcast receiver which has the ease of tuning of conventional push-button tuners but does not require any presetting operations.

It is another object of the invention to provide a new and improved tuner for radio broadcast receivers of the signal-seeking type; that is a tuner in which one operation of a push-button will cause the tuner to seek a station transmitting signal of acceptable field strength and to hold on to such stations until the push-button is operated a second time, when the cycle is repeated.

In accordance with the invention, an automatic signal-seeking tuner for a radio receiver comprises an adjustable tuning apparatus for the receiver, power means for actuating the tuning apparatus, and a normally unbalanced electrical network for controlling the power means. The tuner also includes manually operable means for unbalancing the network in an opposite sense to initiate operation of the power means, and means responsive to the reception of a signal by the receiver for restoring the network to its initial sense of unbalance to arrest actuation of the tuning apparatus.

Referring now to the drawing, Fig. 1 is a circuit diagram, partially schematic, of a broadcast radio receiver including a signal-seeking tuner embodying the invention; Fig. 2 is a graph representing an operating characteristic of the frequency discriminator of the system of Fig. 1; while Fig. 3 is a circuit diagram of a modified form of signal seeking tuner control circuit.

Referring now to Fig. 1 of the drawing, there is represented a complete radio-broadcast receiver including an automatic signal-seeking tuner embodying the invention. This receiver comprises a radio-frequency amplifier unit 10 having input terminals connected to an antenna-ground circuit 11 and output terminals connected to an oscillator-modulator unit 12.

This latter unit is in turn connected to an intermediate-frequency amplifier 13, a frequency discriminator 14, described in more detail hereinafter, a portion of which serves also as a modulation signal detector. The detected modulation signal is applied by way of a circuit 15 and a coupling condenser 16 to a volume control resistor 17 having an adjustable contact 17a which, in turn, is connected through an audio-frequency amplifier 18 to a signal reproducer such as a loud speaker 19 having a field winding 19a constituting a portion of the power supply filter. The radio-frequency amplifier 10 is provided with an adjustable tuning unit schematically represented at 10a while the oscillator-modulator unit is provided with an adjustable tuning unit 12a. An automatic amplication control or A. V. C. bias is developed in any suitable manner as by means of an A. V. C. diode rectifier 15a coupled to the discriminator load circuit through coupling condenser 16 and provided with a load resistor 15b. The A. V. C. bias so developed is applied, as indicated, to one or more of the vacuum tubes of the units 10, 12 and 13 to maintain the amplitude of the signal input to the frequency discriminator 14 approximately constant for a wide range of received signal intensities.

The radio receiver described, per se, forms no part of the present invention and operates in accordance with conventional principles so that a detailed description of its operation is deemed unnecessary. In brief, however, signals intercepted by the antenna system 11 are selected and amplified in the unit 10, converted in the unit 12 into intermediate frequency signals, further selected and amplified in the unit 13, and detected in the unit 14 to derive the modulation signal. This signal is impressed upon the audio-frequency amplifier 18 wherein it is further amplified and applied to the loud speaker 19 for reproduction. The A. V. C. connection from the unit 14 serves to maintain the average signal input to the unit 14 approximately constant and thereby avoids overload of the receiver for strong signals, while providing maximum amplification for weak signals.

The automatic signal-seeking tuner of the invention, as embodied in the receiver described, comprises the adjustable tuning apparatus or units 10a and 12a and power means, such as a reversible electric motor 20, connected by a shaft or mechanism indicated schematically at 21 to actuate the tuning apparatus 10a, 12a. The tuner also includes adjustable vacuum tube impedance means for controlling the energization of the motor 20. This impedance means may comprise a pair of adjustable-impedance space-current paths 22a, 22b of a twin-triode vacuum tube 22 connected selectively to control the energization of the motor 20 for operation in either direction. As illustrated, the motor 20 is of the two-phase induction type provided with one phase-winding 20a connected directly across alternating-current supply terminals 23, which may be the usual house wiring circuit. The motor 20 is provided also with a second phase winding 20b energized with one polarity from the supply terminals 23 through a unity-ratio transformer 24, a phase shifting condenser 25, and an adjustable impedance transformer 26, or with the other polarity directly from the supply terminals 23 through the phase shifting condenser 25 and an adjustable-impedance transformer 27. The secondary windings of the transformer 26 and 27 are adapted to be selectively short circuited through the space-current paths 22a and 22b, respectively, of the adjustable-impedance vacuum tube 22.

The signal-seeking tuner of the invention also includes a normally unbalanced electrical network for developing a control signal to control the impedance means comprising the vacuum tube 22 and transformer 26 and 27, thereby to control the electric motor 20. This network includes a pair of space-current paths 28a and 28b of a vacuum tube 28 connected in parallel across a suitable source +B by way of conductor 29 and anode load resistors 30 and 31 respectively. The cathode of the vacuum tube 28 is connected to the junction of a voltage divider circuit comprising resistors 32 and 33 connected in series across the source +B. It will be understood that the adjustable-impedance tubes 22 and 28 may be either of the high-vacuum type having a continuous bias-impedance characteristic or of the gaseous-discharge type having a discontinuous bias-impedance characteristic.

The network also includes couplings between the space current paths 28a and 28b effective to cause either path rendered conductive to assume all of the network current. To this end there are provided a pair of voltage dividers individually connected between the anodes of the space-current paths 28a, 28b and ground, comprising in series resistors 34, 35, and 36, respectively. The grid of the path 28a is connected to the junction of resistors 34 and 35, while the grid of path 28b is connected to the junction of resistors 36 and 37. In order to cause a given one of the paths 28a, 28b initially to assume the entire network current upon energization of the network, one of the load resistors 30, 31 is made substantially greater than the other; for example, the resistor 30 may have a value twice that of the resistor 31.

The network also includes a voltage-divider circuit comprising resistors 38 and 39 connected in series across the source +B through the field winding 19a of the sound reproducer 19 and thus excited at a potential lower than +B. The output signal of the network is derived between the terminal 40 at the junction of resistor 30 and the anode of space-current path 28a and the terminal 41 at the junction of resistors 38 and 39. The circuit constants are so selected that the network is effective to develop a control signal between the terminals 40 and 41 only when the other path 28b assumes the network current, that is, only when the network is unbalanced in a given sense. The control signal between the terminals 40 and 41 is applied through a reversing switch 42 and resistors 43 and 44 to the control grids of the paths 22a and 22b respectively, of the adjustable-impedance vacuum tube 22 for controlling the impedance of one or the other of the impedance paths 22a, 22b in accordance with the sense of the unbalance of the network and the position of reversing switch 42.

The signal-seeking tuner also includes manually operable means for unbalancing the network described in opposite sense to modify the control signal developed at the terminals 40, 41, thereby to initiate operation of the motor means in a direction dependent upon the position of switch 42. This manually operable means may comprise a starting push button or a conventional multi-station push-button tuner or, as illustrated, a combination of these two devices. Specifically, this means comprises a two-position push-button switch 45 connected to impress the source +B upon the control grid of the path 28b through an isolating grid resistor 46. The two-position switch 45 is mechanically connected by a shaft or mechanism indicated schematically at 47 to the reversing switch 42 so that the two switches are connected for operation in unison. In parallel with the contacts of the push-button switch 45, are the several contacts of a multi-station selector 48 of the commutator type comprising a series of commutator discs 48a, 48b, 48c and 48d and cooperating push-button contacts 49a, 49b, 49c and 49d, respectively. The station selector 48 is represented schematically since it forms no part of the present invention.

The signal-seeking tuner also includes means responsive to the reception of a signal by the receiver for rebalancing the network to arrest actuation of the tuning apparatus by the motor 20. To this end, an amplified audio-frequency signal developed at the anode of the amplifier 18 is applied through a coupling condenser 50 to the control grid of the space-current path 28b to render this path non-conductive, whereby the entire network current is assumed by the space-current path 28a.

The signal-seeking tuner also includes additional means responsive to the reception of a signal for applying an auxiliary control signal to the motor 20 by way of the adjustable-impedance vacuum tube 22 until the receiver is accurately tuned to the received signal. The means for developing this auxiliary control signal is the frequency discriminator 14. This discriminator may be of conventional form comprising a primary tuned circuit 14a inductively coupled to a secondary tuned circuit 14b and provided with a circuit for coupling the signal across the primary circuit 14a into the electrical midpoint of the circuit 14b. The sum and difference of the primary and secondary signals are applied to the discriminator rectifiers 14d and 14e of a twin-diode rectifier tube 14f. The cathodes of the paths 14d and 14e of tube 14f are connected by way of regulating resistors 51 and 52 to the load resistors 43 and 44, respectively, and to the control electrodes of the space-current paths 22a and 22b, respectively. Carrier-frequency and audio-frequency by-pass condensers are included in the load circuit of the discriminator 14 as required, while the cathode of the vacuum tube 22 is by-passed to ground for carrier-frequency and audio-frequency signals by way of a condenser 53. As is well understood, the frequency discriminator 14 is effective to develop an output signal or auxiliary control signal of opposite polarities for mistuning of the receiver in opposite senses.

The signal-seeking tuner also includes means responsive to adjustment of the tuning apparatus to either of its extreme positions for reversing the polarity of the output of the network at the terminals 40, 41 to reverse the direction of operation of the motor means. This comprises the mechanical connection 21 between the motor 20 and the reversing switch 42 which is so arranged that it operates the reversing switch in opposite directions at the two limits of travel of the tuning apparatus, as driven by the motor 20.

Referring now to the operation of the signal-seeking tuner described, it will be assumed that initially the receiver is not tuned to a station. Due to the fact that the value of resistor 30 is substantially twice that of resistor 31 when the set is first turned on, the anode potential of the space path 28*b* of the tube 28 rises more rapidly than that of the path 28*a* while the coupling from the anode of path 28*b* to the grid of path 28*a* renders the latter more conductive. The couplings between the two paths are regenerative so that path 28*a* assumes the entire network current and the network is normally unbalanced in a predetermined sense. It will be noted that the network output terminal 40 is at a junction of the voltage divider comprising resistor 30, the space-current path 28*a* and resistor 33 connected across the source +B while the output terminal 41 comprises a junction of the voltage divider circuit comprising the speaker field 19*a*, resistor 38 and resistor 39. The circuit constants are so selected that, under the conditions assumed, no difference of potential exists between the terminals 40 and 41 and, since no signal is being received, no control signal is developed by the discriminator 14 and no control signal is impressed upon the control grid of either of the impedance paths 22*a* or 22*b* of the vacuum tube 22. The tube 22 is selected of a type such that, with no signal on its control grids, the impedances of the paths 22*a* and 22*b* are low and equal. However, the cathode of tube 22 is biased by the potential difference between +B and point 41 so that both paths are biased to cut-off in the absence of a control signal on either grid. Thus the secondary windings of the impedance transformers 26 and 27 are substantially at open circuit and the excitation of the winding 20*b* of the motor 20 is zero due to the small but opposite excitation currents supplied through the transformers 26 and 27. Therefore, the signal-seeking tuner is inactive.

If now it is desired to initiate operation of the tuner to seek a signal from a broadcasting station, the switch 45 is manually operated to one of its positions, thereby impressing the source +B on the control grid of the path 28*b* of tube 28 through the isolating resistor 46. This positive potential pulse causes the path 28*b* momentarily to become more conductive than path 28*a*, whereby it tends to assume current from the path 28*a*. As the path 28*a* becomes less conductive, its anode potential rises, still further increasing the potential on the grid of the path 28*b* and the transfer of current continues rapidly until the path 28*b* assumes the entire network current and the network is unbalanced in the opposite sense. With substantially no current flowing in the path 28*a*, the output terminal 40 connected to the anode of the path 28 rises to substantially +B so that a control signal is developed between the terminals 40 and 41 which is impressed through the reversing switch 42 and isolating resistors 43 and 44 on the control grids of the paths 22*a* and 22*b*. The polarity of this control signal, as applied to the control electrodes of the paths 22*a* and 22*b*, depends of course upon the position of the reversing switch 42. It may be assumed that the push button switch 45 was initially operated in such a direction as to close the reversing switch 42 on its right-hand contacts thereby connecting the output terminal 40 to the grid of the path 22*a* and the terminal 41 to the grid of the path 22*b*. The result of this connection is to increase the conductivity and to decrease the impedance of the path 22*a* and simultaneously to increase the impedance of the path 22*b*. As a result, the transformer 26 is substantially short-circuited, permitting the energization of the winding 20*b* through the transformer 24 to produce rotation of the motor in a given direction. The motor 20 is connected by way of the mechanism 21 to the tuning units 10*a* and 12*a* and continuously adjusts the tuning of the receiver over its tuning range.

When the receiver is tuned to a station from which a signal of acceptable strength is being received, two effects occur. In the first place, an amplified detected audio-frequency signal from the anode of the audio-frequency amplifier 18 is impressed through the coupling condenser 50 upon the grid of the path 28*b* of the tube 28. Since this path is already fully conductive, the positive half-cycles of this signal have no effect but the negative half-cycles normally reduce its conductivity substantially and effect a transfer of the network current from the path 28*b* back to the path 28*a* in the manner described above, thus restoring the network to its initial sense of unbalance and reducing to zero the control signal developed between the terminals 40 and 41. In case the receiver is tuned to a station that is transmitting momentarily an unmodulated carrier signal, the carrier pulse translated by the receiver when tuning to the station will itself trigger the network to produce a similar result. Either of these effects alone tends to stop the motor 20 as soon as the receiver is tuned to a signal of appreciable strength and in certain applications may be an adequate control.

However, for more accurate control of the tuning motor 20, the use of the discriminator 14 is desirable. As is well understood in the art, this type of discriminator is effective to develop a control signal of opposite polarities for mistuning of the receiver in opposite senses, the control signal characteristic being represented by Fig. 2 which is typical for such a unit. The control signal developed by the discriminator 14, as represented by Fig. 2, is applied by way of the isolating resistors 51 and 52 to the control grids of the paths 22*a* and 22*b* respectively. It will be obvious from the foregoing description that one or the other of the paths 22*a*, 22*b* will be rendered conductive by the auxiliary control signal, depending upon the sense of mistuning of the receiver at the time the control signal from the normally unbalanced network disappears, as described above. By a proper connection of the discriminator 14 to the control grids of the tube 22, the motor 20 may be driven under the influence of the control signal in a direction to reduce the mistuning of the receiver. By designing the discriminator 14 and the control circuits of the motor 20 with sufficient sensitivity, the motor 20 may be made effective to tune the receiver very precisely to the incoming signal. Thus, it is seen that the adjustable impedance tube 22 and impedance transformers 26 and 27 comprise means responsive jointly to the magnitudes and the polarities of the control signal developed between terminals 40 and 41 and the auxiliary control signal developed by the discriminator 14 and that this means is effective to arrest actuation of the tuning apparatus only when the auxiliary control signal from the discriminator 14 is reduced to zero.

It has been found that with the arrangement described there is no dead spot at or near the center of the characteristic of the discriminator 14 corresponding to a precise tuning of the receiver. This is due to the fact that the audio-frequency signal applied to the unbalanced network from the audio-frequency amplifier 18 regularly triggers the path 28b both positively and negatively so that the network current repeatedly transfers back and forth between the paths 28a and 28b, correspondingly stopping and starting the motor 20 under the control of the auxiliary signal from the discriminator 14. However, the angular movement of the tuning apparatus is so small that its effect on the tuning of the receiver is inappreciable. The effect is similar to that of manually jarring or shock-exciting a mechanical movement to eliminate its dead spot due to static friction.

If, after the push-button switch 45 is operated, no station is broadcasting within the tuning range of the tuning units 10a, 12a, the motor 20 actuates these tuning units to the limits of their tuning range, whereupon through the mechanism 21 it actuates the reversing switch 42 to make the other path 22b of the tube 22 conductive, thereby effectively to short-circuit the secondary winding of the impedance transformer 27 to excite the winding 20b with reverse polarity and reverse the direction of rotation of the motor. The motor 20 then tunes the receiver in the reverse sense, and, if no signal is still received, it adjusts the tuning apparatus to its other extreme of the tuning range, whereupon the reversing switch 42 is again actuated and the cycle described is repeated until the receiver is turned off. In case the receiver is turned off while it is tuned to and receiving a given signal, when it is subsequently turned on it will remain tuned to this station under the influence of the frequency discriminator 14, since the unbalanced network always warms up with the network current being carried by the path 28a, under which conditions no control signal is developed at the terminals 40, 41.

It will be understood that if, in lieu of operating the automatic push-button switch 45, any of the station push-buttons 49a—49d, inc. are operated, these push-buttons act in conjunction with the selector discs 48a—48d, incl. respectively to operate the tuning motor 20 to a position corresponding to the setting of the particular selector disc. In this arrangement +B is maintained continuously on the grid of the path 28b to maintain the network current through this path in spite of audio-frequency signals which may be impressed thereon from the audio-frequency amplifier 18 prior to reaching the station for which the particular selector disc is set.

Thus, there is provided by the automatic signal-seeking tuner described, an arrangement for automatically tuning a broadcast receiver continuously over its tuning range until it is tuned to a station of acceptable signal strength, whereupon the tuning operation is arrested. Further, operation of the push-button switch 45 is effective to cause the tuner to tune the receiver to successive stations, it only being necessary in such an operation to hold the push-button switch 45 closed during the period of time required to tune away from the received signal sufficiently that the auxiliary control signal developed by the discriminator 14 will not, upon the release of the switch 45, cause the motor 20 to return the tuning apparatus to the same station. Alternatively, by pushing any one of the selected station selectors 49a—49d, inc., the receiver is tuned in a conventional manner to any particular station selected and the descriminator 14 acts to tune the receiver precisely to such station.

In Fig. 3 there is represented a modified form of the signal-seeking tuner control apparatus adapted for operation by a direct-current motor 60 in place of the polyphase alternating-current motor 20 of the system of Fig. 1. The several circuit elements of the system of Fig. 3 corresponding to those of Fig. 1 are identified by the same reference characters. In this arrangement the armature 60a of the motor is connected permanently across a suitable direct-current source, such as a battery 61, the voltage being sufficiently low to avoid excessive heating, even while stalled. The motor 60 is also provided with field windings 60b and 60c connected to provide rotation of the motor 60 in opposite directions. The field windings 60b and 60c are energized from a suitable source +B through the adjustable impedance paths 22a and 22b of the vacuum tube 22. The motor 60 is connected through a shaft or mechanism 21 to actuate the tuning apparatus of the receiver (not shown) and the reversing switch 42 as in the system of Fig. 1.

The normally unbalanced network of the system of Fig. 3 is similar to that of Fig. 1 with the exception that the output terminal 41 is connected to an adjustable contact 62a of a voltage divider resistor 62 connected across the source +B. In this instance the transfer of the network current from the path 28a in which it is initiated to the path 28b is effected by short-circuiting the resistor 30 by means of contacts 63a of a manually operable push-button switch 63. The network output terminals 40 and 41 are connected to the reversing switch 42 through isolating resistors 64.

In order to avoid the necessity of holding the push-button switch 63 closed during the interval when the motor 60 is tuning the receiver away from any station being received, the tuner includes means for temporarily reducing the gain of the receiver simultaneously with the unbalancing of the network in order to reduce the effect of any signal then being received on the operation of the motor 60. To this end, the push-button switch 63 is provided with auxiliary contacts 63b which are effective to connect the source —B to the A. V. C. circuit through a time-constant network comprising a series resistor 65 and shunt condenser 66. Further, time-constant circuits comprising a parallel-connected resistor 67 and condenser 68 and a parallel-connected resistor 69 and condenser 70 are included in the connections from the discriminator 14 to the control grids of the adjustable impedance paths 22a and 22b, respectively, in order to control the speed of the motor during the tuning operation, as described hereinafter.

The operation of the system of Fig. 3 is generally similar to that of Fig. 1 described above. Operation of the push-button switch 63 is effective to unbalance the network comprising the tube 28 in the opposite sense and cause the path 28b to assume the network current. This operation is effective to develop between the terminals 40 and 41 a control signal which is applied through the reversing switch 42 to the impedance paths *22a*, *22b*, thereby to energize one of the field windings 60a, 60b of the motor 60. The motor 60 thereupon rotates in a predetermined direction to adjust the tuning apparatus of the receiver, as in the system of Fig. 1. Simultaneously the closing of the contacts 63b of the switch 63 is effective to develop a negative potential across the condenser 66 in the A. V. C. connection, thereby temporarily to reduce the gain of the receiver so that there is no tendency of any control signal developed by the discriminator 14 to gain control of the motor 60 and retune it to the station which was previously being received. The time constants of the resistor 65 and condenser 66 and the associated A. V. C. circuit are so selected that this negative potential upon the condenser 66 substantially leaks off within the period required to tune the receiver from the station being received by an amount beyond the range of control of the discriminator 14.

As indicated in the discriminator characteristic of Fig. 2, as the receiver is tuned approximately to a station, the control signal developed thereby decreases from a maximum to zero at the center of the channel and then increases with opposite polarity as the receiver is tuned through the station. Since the characteristic of the motor 60 is to increase its speed with decreased field excitation, it is apparent that, with this arrangement alone, the motor would tend to increase in speed as it approached the center of the channel to which the receiver was being tuned, while it is preferable to approach such a position at progressively decreasing speed. To avoid this characteristic, the time-constant circuits 67, 68 and 69, 70 are included in series in the control-grid circuits of the impedance paths 22a, 22b, respectively. These circuits are effectively differentiating circuits which are effective to advance the signal on the control grids so as to anticipate the approach to the center of the channel to which the receiver is being tuned. The signal thus differentiated reverses polarity before the receiver is tuned to the center of the channel so that the motor 60 coasts into the center of the channel under reverse field excitation, providing a dynamic breaking of the motor. If the motor should stop before it coasted to the center of the channel, the result would be so to modify the differentiated control signal of the discriminator 14 as again to reverse its polarity and cause the motor to rotate in the original direction at a greatly reduced speed; that is, the motor effectively crawls toward the center of the channel to which the receiver is being tuned.

While there have been described what are at present considered to be the preferred embodiments of the invention, it will be apparent to those skilled in the art that various changes and modifications may be made therein without departing from the spirit or scope of the invention.

What is claimed as new is:

1. An automatic signal-seeking tuner for a radio receiver comprising, an adjustable tuning apparatus for the receiver, power means for actuating said tuning apparatus, an electrical network for controlling said power means including a pair of parallel paths one of which has greater impedance than the other, manually operable means for reducing the impedance of said one path to initiate operation of said power means, and means responsive to the reception of a signal by the receiver for restoring said network to its initial condition to arrest actuation of said tuning apparatus.

2. An automatic signal-seeking tuner for a radio receiver comprising, an adjustable tuning apparatus for the receiver, electric motor means for actuating said tuning apparatus, adjustable vacuum-tube impedance means for controlling the energization of said motor means, an electrical network for controlling said impedance means including parallel paths having different impedances so that said network is normally unbalanced, manually operable means for unbalancing said network in an opposite sense to initiate operation of said electric motor means, and means responsive to the reception of a signal by the receiver for restoring said network to its initial sense of unbalance to arrest actuation of said tuning apparatus.

3. An automatic signal-seeking tuner for a radio receiver comprising, an adjustable tuning apparatus for the receiver, reversible electric motor means for actuating said tuning apparatus, vacuum-tube means including a pair of adjustable-impedance space-current paths connected selectively to control the energization of said motor means for operation in either direction, means including a normally unbalanced electrical network for controlling the impedance of one or the other of said paths, manually operable means for selectively unbalancing said network in an opposite sense to initiate operation of said motor means in either direction and means responsive to the reception of a signal by the receiver for restoring said network to its initial sense of unbalance to arrest actuation of said tuning apparatus.

4. An automatic signal-seeking tuner for a radio receiver comprising, an adjustable tuning apparatus for the receiver, reversible electric motor means for actuating said tuning apparatus, vacuum-tube means including a pair of adjustable-impedance space-current paths connected selectively to control the energization of said motor means for operation in either direction, means including a normally-unbalanced electrical network for controlling the impedance of one or the other of said paths, manually operable means for selectively unbalancing said network in an opposite sense to initiate operation of said motor means in either direction, means responsive to the reception of a signal by the receiver for restoring said network to its initial sense of unbalance to arrest actuation of said tuning apparatus, and means responsive to adjustment of said tuning apparatus to either of its extreme positions for reversing the polarity of the output of said network to reverse the direction of operation of said motor means.

5. An automatic signal-seeking tuner for a radio receiver comprising, an adjustable tuning apparatus for the receiver, power means for actuating said tuning apparatus, a normally-unbalanced electrical network for controlling said power means, manually operable means for unbalancing said network in an opposite sense to initiate operation of said power means, means responsive to the reception of a signal by the receiver for restoring said network to its initial sense of unbalance to arrest actuation of said tuning apparatus, and additional means responsive to the reception of a signal for applying an auxiliary control signal to said power means until the receiver is accurately tuned to the received signal.

6. An automatic signal-seeking tuner for a radio receiver comprising, an adjustable tuning apparatus for the receiver, power means for actuating said tuning apparatus, a normally-unbalanced electrical network for controlling said power means, manually operable means for unbalancing said network in an opposite sense to initiate operation of said power means, means responsive to the reception of a signal by the receiver for restoring said network to its initial sense of unbalance to arrest actuation of said tuning apparatus, and a frequency discriminator for applying an auxiliary control signal to said power means until the receiver is accurately tuned to the received signal.

7. An automatic signal-seeking tuner for a radio receiver comprising, an adjustable tuning apparatus for the receiver, power means for actuating said tuning apparatus, a normally-unbalanced electrical network for developing a control signal, a frequency-discriminator network for developing an auxiliary control signal, means responsive jointly to said control signals for controlling said power means, manually operable means for unbalancing said network in an opposite sense to initiate operation of said power means, and means responsive to the reception of a signal by the receiver for restoring said network to its initial sense of unbalance to arrest actuation of said tuning apparatus when said auxiliary control signal is reduced to zero.

8. An automatic signal-seeking tuner for a radio receiver comprising, an adjustable tuning apparatus for the receiver, power means for actuating said tuning apparatus, a normally-unbalanced electrical network for developing a control signal, a frequency-discriminator network for developing an auxiliary control signal of opposite polarities for mistuning of the receiver in opposite senses, means responsive jointly to the magnitudes and polarities of said two signals for controlling said power means, manually operable means for unbalancing said network in an opposite sense to initiate operation of said power means and means responsive to the reception of a signal by the receiver for restoring said network to its initial sense of unbalance to arrest actuation of said tuning apparatus when said auxiliary control signal is reduced to zero.

9. An automatic signal-seeking tuner for a radio receiver comprising, an adjustable tuning apparatus for the receiver, power means for actuating said tuning apparatus an electrical network including a pair of space-current paths in parallel and couplings therebetween effective to cause either path rendered conductive to assume all of the current of the network and an output circuit effective to develop a control signal for controlling said power means, the impedance of one path being greater than that of the other so that said other path is normally conductive manually operable means for reducing the impedance of said one path so that said one path is rendered conductive to modify said control signal, thereby to initiate operation of said power means, and means responsive to the reception of a signal by the receiver for restoring said network to its initial condition to arrest actuation of said tuning apparatus.

10. An automatic signal-seeking tuner for a radio receiver comprising, an adjustable tuning apparatus for the receiver, power means for actuating said tuning apparatus, a normally-unbalanced electrical network for controlling said power means including a pair of space-current paths in parallel and couplings therebetween effective to cause either path rendered conductive to assume all of the current of the network and to cause a given one of said paths initially to assume such network current upon energization of the network and an output circuit effective to develop a control signal only when the other of said paths assumes the network current, manually operable means for unbalancing said network to cause said other path to assume the network current, thereby to initiate operation of said power means, and means responsive to the reception of a signal by the receiver for restoring said network to its initial sense of unbalance to arrest actuation of said tuning apparatus.

11. An automatic signal-seeking tuner for a radio receiver comprising, an adjustable tuning apparatus for the receiver, power means for actuating said tuning apparatus, a normally-unbalanced electrical network for controlling said power means including a pair of space-current paths in parallel and couplings therebetween effective to cause either path rendered conductive to assume all of the current of the network and to cause a given one of said paths initially to assume such network current upon energization of the network and an output circuit effective to develop a control signal only when the other of said paths assumes the network current, manually operable means for unbalancing said network to cause said other path to assume the network current, thereby to initiate operation of said power means, and means for applying a received signal to said other of said paths to render it non-conductive, thereby to restore said network to its initial sense of unbalance to arrest actuation of said tuning apparatus.

12. An automatic signal-seeking tuner for a radio receiver including an adjustable gain control comprising, an adjustable tuning apparatus for the receiver, power means for actuating said tuning apparatus, an electrical network for controlling said power means including parallel paths having different impedances so that said network is normally unbalanced, manually operable means for unbalancing said network in an opposite sense to initiate operation of said power means, and for temporarily reducing the gain of the receiver to reduce the effect of any signal then being received, and means responsive to the reception of a signal by the receiver for restoring said network to its initial sense of unbalance to arrest actuation of said tuning apparatus.

13. An automatic signal seeking tuner for a radio receiver comprising, an adjustable tuning apparatus for the receiver, a reversible electric motor for actuating said apparatus including a winding adapted to be selectively energized in opposite polarities for causing operation of said motor in opposite directions, a pair of transformers connected to said winding for controlling the current therein, vacuum tube means including a pair of adjustable-impedance space-current paths connected individually to said transformers to control the polarity of the current supplied to said winding, means including a normally unbalanced electrical network for controlling the impedance of one or the other of said paths, manually operable means for selectively unbalancing said network in an opposite sense to initiate operation of said motor means in either direction and means responsive to the reception of a signal by the receiver for restoring said network to its initial sense of unbalance to arrest actuaton of said tuning apparatus.

14. An automatic signal seeking tuner for a radio receiver comprising, an adjustable tuning apparatus for the receiver, a reversible direct current motor for actuating said apparatus including a pair of field windings adapted to be selectively excited for causing operation of said motor in opposite directions, vacuum tube means including a pair of adjustable-impedance space-current paths connected individually to said windings to control operation of said motor, means including a normally unbalanced electrical network for controlling the impedance of one or the other of said paths, manually operable means for selectively unbalancing said network in an opposite sense to initiate operation of said motor means in either direction and means response to the reception of a signal by the receiver for restoring said network to its initial sense of unbalance to arrest actuation of said tuning apparatus.

ELMER G. HILLS.

REFERENCES CITED

The following references are of record in the file of this patent:

UNITED STATES PATENTS

| Number | Name | Date |
|---|---|---|
| 2,020,275 | Beers | Nov. 5, 1935 |
| 2,098,331 | Bowman | Nov. 9, 1937 |
| 2,112,686 | Barton | Mar. 29, 1938 |
| 2,190,319 | Koch | Feb. 13, 1940 |
| 2,197,933 | Kirkwood | Apr. 23, 1940 |
| 2,210,425 | Newman | Aug. 6, 1940 |
| 2,262,218 | Andrews | Nov. 11, 1941 |
| 2,287,925 | White | June 30, 1942 |
| 2,302,893 | Roberts | Nov. 24, 1942 |
| 2,326,737 | Andrews | Aug. 17, 1943 |
| 2,369,542 | Dietrich | Feb. 13, 1945 |
| 2,379,689 | Crosby | July 3, 1945 |
| 2,393,400 | Noviksetat | Jan. 22, 1946 |
| 2,426,580 | O'Brien | Aug. 26, 1947 |